(12) United States Patent
Kolwalkar et al.

(10) Patent No.: US 9,759,798 B2
(45) Date of Patent: Sep. 12, 2017

(54) CALIBRATION METHODS FOR VOLTAGE SENSING DEVICES

(71) Applicant: General Electric Company, Schenectady, NY (US)

(72) Inventors: Amol Rajaram Kolwalkar, Bangalore (IN); Sameer Dinkar Vartak, Bangalore (IN); Arun Kumar Raghunathan, Bangalore (IN); Abhijeet Arvind Kulkarni, Pune (IN); Charles Brendan O'Sullivan, Castletroy (IE)

(73) Assignee: General Electric Company, Niskayuna, NY (US)

( * ) Notice: Subject to any disclaimer, the term of this patent is extended or adjusted under 35 U.S.C. 154(b) by 154 days.

(21) Appl. No.: 14/276,253

(22) Filed: May 13, 2014

(65) Prior Publication Data
US 2015/0331079 A1 Nov. 19, 2015

(51) Int. Cl.
*G01R 35/00* (2006.01)
*G01R 19/25* (2006.01)
*G01R 15/14* (2006.01)

(52) U.S. Cl.
CPC ......... *G01R 35/005* (2013.01); *G01R 15/144* (2013.01); *G01R 19/2503* (2013.01)

(58) Field of Classification Search
CPC .. G01R 35/005; G01R 19/2503; G01R 35/00; G01R 29/18; G01R 15/14; G01R 19/2513; G01R 29/16; G01R 15/06
(Continued)

(56) References Cited

U.S. PATENT DOCUMENTS 5,473,244 A 12/1995 Libove et al.
6,529,013 B2 3/2003 Skendzic et al.
(Continued)

FOREIGN PATENT DOCUMENTS

WO 2012098099 A1 7/2012
WO 2012130816 A1 10/2012
WO 2013024244 A1 2/2013

OTHER PUBLICATIONS

"Contactless Surge Sensor Using a Distributed Closed Loop Detector", Generation, Transmission 1 and Distribution, IEE Proceedings—vol. 146, Issue: 2, pp. 101-106, Mar. 1999.*
(Continued)

*Primary Examiner* — Son Le
*Assistant Examiner* — Akm Zakaria
(74) *Attorney, Agent, or Firm* — Nitin N. Joshi

(57) ABSTRACT

A calibration method for enhancing a measurement accuracy of one or more voltage sensing devices in presence of a plurality of conductors is provided. The method includes operatively coupling at least one voltage sensing device of the one or more voltage sensing devices to a respective conductor of the plurality of conductors and determining a sensed voltage value of the respective conductor using the at least one voltage sensing device The method further includes determining a calibration matrix having cross-coupling factors representative of cross-coupling between an antenna of the at least one voltage sensing device and other conductors of the plurality of conductors and determining a corrected voltage value of the respective conductor by deducting at least in part contributions of the cross-coupling from the sensed voltage value of the respective conductor using the calibration matrix.

19 Claims, 6 Drawing Sheets

(58) Field of Classification Search
USPC .......................................... 702/104; 324/629
See application file for complete search history.

(56) References Cited

U.S. PATENT DOCUMENTS

| | | | |
|---|---|---|---|
| 6,734,658 B1 | 5/2004 | Bierer | |
| 7,109,699 B1 | 9/2006 | Bierer | |
| 7,474,404 B2 | 1/2009 | VanWiggeren | |
| 8,405,405 B2* | 3/2013 | Tsironis | G01R 27/32 324/638 |
| 8,493,053 B2 | 7/2013 | De Buda | |
| 8,493,054 B2 | 7/2013 | El-Essawy et al. | |
| 2005/0043055 A1* | 2/2005 | Vance | H01Q 1/243 455/550.1 |
| 2005/0285590 A1* | 12/2005 | Higgins | G01B 7/004 324/207.17 |
| 2008/0088510 A1* | 4/2008 | Murata | H01Q 3/24 343/700 MS |
| 2008/0186012 A1* | 8/2008 | Rahmatian | H02B 13/065 324/107 |
| 2010/0308852 A1* | 12/2010 | Unmuessig | G01R 35/00 324/750.3 |
| 2012/0253726 A1* | 10/2012 | Xu | G01R 35/005 702/104 |
| 2012/0299602 A1 | 11/2012 | Chiu et al. | |
| 2012/0319675 A1* | 12/2012 | El-Essawy | G01R 35/02 324/74 |
| 2013/0069627 A1 | 3/2013 | Cs et al. | |
| 2013/0154674 A1 | 6/2013 | Nagpal | |
| 2013/0211751 A1 | 8/2013 | Park et al. | |

OTHER PUBLICATIONS

A European Search Report and Opinion issued in connection with corresponding EP Application No. 15167253.2 on Nov. 2, 2015.

Yamabuki et al., "Contactless Surge Sensor Using a Distributed Closed Loop Detector", Generation, Transmission and Distribution, IEE Proceedings—(vol. 146, Issue: 2), pp. 101-106, Mar. 1999.

Bayram et al., "Characterization of Cross-Coupling in Capacitive Micromachined Ultrasonic Transducers", Ultrasonics Symposium, 2005 IEEE (vol. 1), pp. 601-604, Sep. 18-21, 2005.

* cited by examiner

CALIBRATION METHODS FOR VOLTAGE SENSING DEVICES

BACKGROUND

Embodiments of the present specification relate to voltage sensing devices, and more particularly to calibration methods for the voltage sensing devices.

Recently, deregulation of the electricity supply market has led to increased competition between electricity providers. It is now relatively common for companies and households to have a choice of several different electricity providers when deciding on an electricity provider to supply their electricity needs. This has led to competition between the different providers over matters including pricing and quality of supply. Further, sometimes electricity providers need to supply their customers with less expensive electricity while still assuring the same or improved quality of supply to their customers. In order to achieve these goals the electricity providers have to improve the efficiency of electricity networks or electricity distribution system. Furthermore, due to deregulation, network losses and interruption to electricity supply are now being penalized.

Typically, it has been found that even in highly developed countries, approximately 10% of all electricity generated is lost within the electricity networks themselves. For example, a portion of the electricity being transmitted through a current carrying cable, also referred to as a "power line" of an electricity network may be lost as a result of transmission losses. This figure representing electricity loss within the electricity network rises to almost 25% in less developed nations. This loss of power in the electricity network may be due to undetected faults. Further, these faults may go undetected for long periods of time. Moreover, even when the faults are detected, it is usually challenging to locate the faults over an expansive electricity network. By providing the information of the electrical properties in the electricity network (e.g., by monitoring the electricity networks) in an accurate manner, electricity providers may be able to significantly reduce the amount of electricity lost in the electricity networks and make considerable savings in the cost of generating the electricity. Furthermore, by closely monitoring the electricity networks electricity providers will be in a better position to correct faults in the electricity networks swiftly with a minimum of inconvenience to their customers, thereby providing an improved quality of supply to their customers.

A variety of sensors have been developed for measuring a current in a current carrying cable, such as a current carrying cable in a high voltage electricity distribution system. For example, optical current sensors are used to measure the current in the current carrying cable. The optical current sensors are generally based on the Faraday effect. Some optical current sensors use bulk glass or fiber optic cables that surround the current carrying cable. Although the optical current sensors have a very high dynamic range, however, the optical current sensors require opening the current carrying cable at installation, which may be an expensive procedure.

Other kinds of sensors that are used for measuring voltages in the electricity networks may employ metal shells disposed around the current carrying cables. These sensors use the metal shells as capacitance dividers between the current carrying cables and a ground underneath. Among other factors, the capacitance between the shells and the current carrying cables depends on the distance between the shells and the current carrying cables. Accordingly, the metal shells may have limited capacitance between the current carrying cables and the shells themselves because of a limit on a gap between the shells and the current carrying cables. Further, due to the limited capacitance, the sensor may be influenced by changes in surrounding conductors, such as measuring circuits. Moreover, an increase in an area of the shell to increase a capacitance between the shells and the current carrying cables typically results in an increase in a parasitic capacitance of the sensor. The increased parasitic capacitance makes the sensor relatively more prone to fluctuations in the surrounding conductors.

Further, in cases of sensors configured to measure voltage values in the power line, the voltage measurement entails physically connecting the voltage measuring device to the voltage line and to the ground. This physical connection between the voltage measuring device and the ground is required to prevent monitored values being undesirably affected by the presence of any object that may exist between the ground and the voltage measuring device. By way of example, a passing vehicle, a tree, an animal, or a bird, or any other object intentionally or unintentionally disposed in close vicinity of the ground and/or the voltage measuring device may result in undesirable changes in the measurement values of the voltage measurement device in absence of the physical connection between the voltage measuring device and the ground. It may be noted that providing this physical connection between the voltage measuring devices and the ground requires complex installation procedures. For example, such installation procedures are both time consuming and labor intensive resulting in an increase in the cost of installing the voltage measuring device. Further, the physical connection to the ground may need to be maintained and periodically checked.

BRIEF DESCRIPTION

In accordance with aspects of the present specification, a calibration method for enhancing a measurement accuracy of one or more voltage sensing devices in presence of a plurality of conductors is provided. The method includes operatively coupling at least one voltage sensing device of the one or more voltage sensing devices to a respective conductor of the plurality of conductors and determining a sensed voltage value of the respective conductor using the at least one voltage sensing device The method further includes determining a calibration matrix having cross-coupling factors representative of cross-coupling between an antenna of the at least one voltage sensing device and other conductors of the plurality of conductors and determining a corrected voltage value of the respective conductor by deducting at least in part contributions of the cross-coupling from the sensed voltage value of the respective conductor using the calibration matrix.

In accordance with another aspect of the present specification, a method for determining individual voltage values of one or more power lines of multi-phase power lines is provided. The method includes operatively coupling respective contactless voltage sensing devices to one or more power lines of the multi-phase power lines. Further, each of the respective contactless voltage sensing devices includes a first impedance element having a first impedance, where the first impedance element is configured to be operatively coupled to a respective power line of the one or more power lines, an antenna operatively coupled to the first impedance element, a second impedance element having a second impedance, and measurement and communication circuitry operatively coupled to the first impedance element. Moreover, the second impedance element is formed in part by the antenna and a parasitic impedance element, and where the parasitic impedance element includes a parasitic impedance. The method further includes determining sensed voltage values for the one or more power lines of the multi-phase power lines using the respective contactless voltage sensing devices. Additionally, the method includes determining a calibration matrix comprising cross-coupling factors, where the cross-coupling factors are representative of cross-coupling between the respective contactless voltage sensing devices and other power lines of the multi-phase power lines. Also, the method includes determining the individual voltage values of the respective power lines by deducting at least in part contributions of the cross-coupling from the sensed voltage values using the calibration matrix.

In accordance with yet another aspect of the present specification, a monitoring system having a plurality of conductors, a plurality of contactless voltage sensing devices, and a monitoring unit is provided. The monitoring unit is operatively coupled to one or more contactless voltage sensing devices of the plurality of contactless voltage sensing devices and configured to determine voltage values of the respective conductor of the plurality of conductors.

DRAWINGS

These and other features, aspects, and advantages of the present specification will become better understood when the following detailed description is read with reference to the accompanying drawings in which like characters represent like parts throughout the drawings, wherein.

Figure 5:
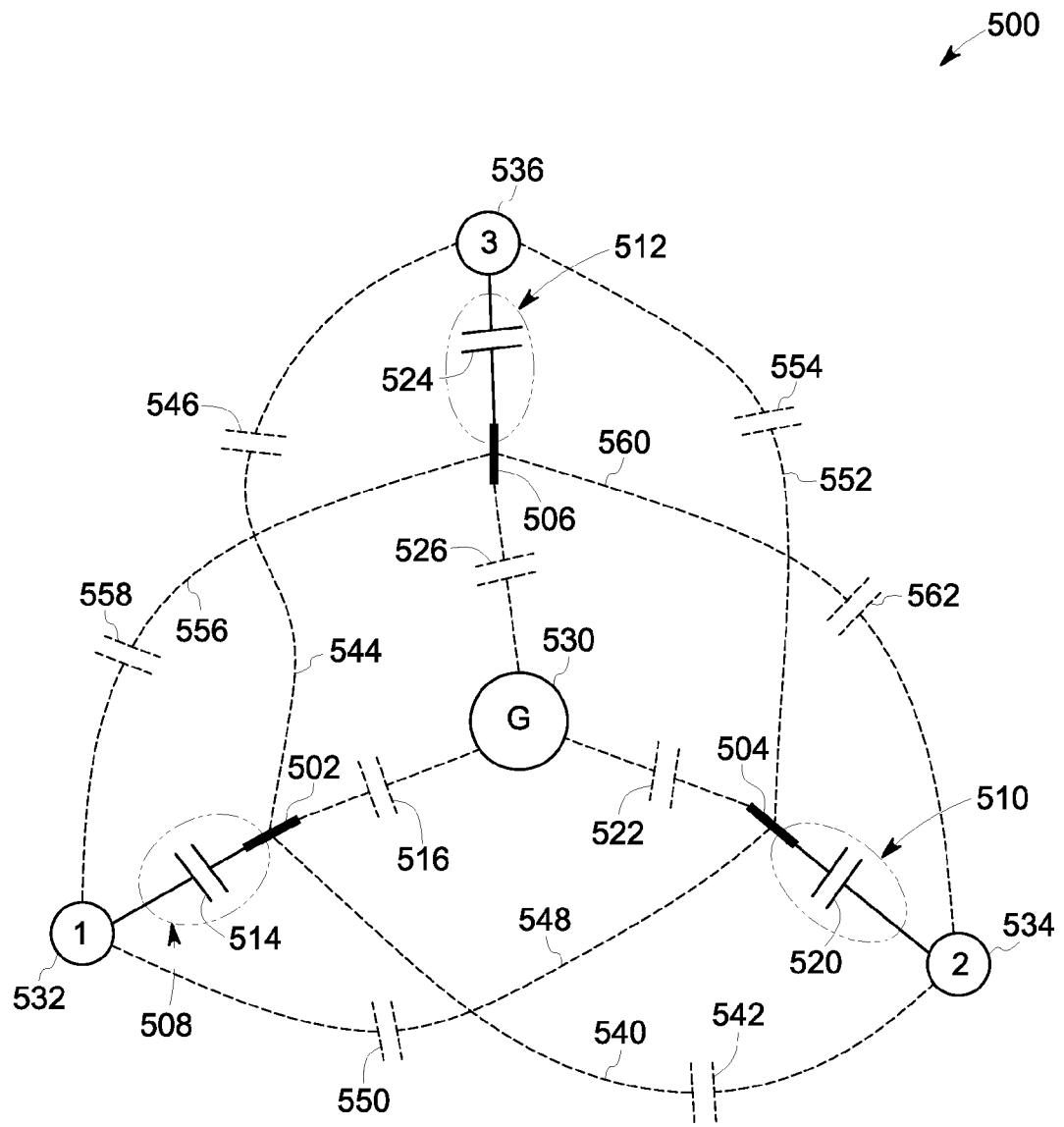
Figure 6:
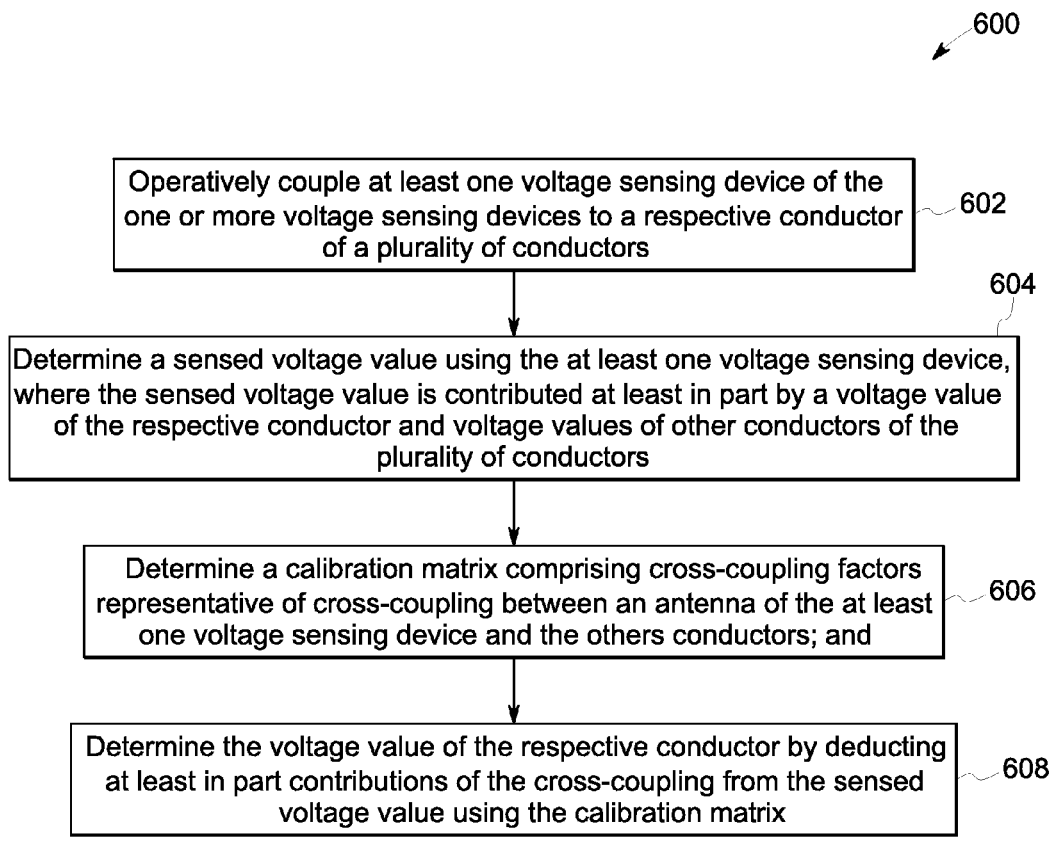

FIG. 5 is a schematic representation of cross-coupling between respective antennae of contactless voltage sensing devices and neighboring conductors of the contactless voltage sensing devices, in accordance with aspects of the present specification; and FIG. 6 is a flow chart for an exemplary method for installing and calibrating a contactless voltage sensing device, in accordance with aspects of the present specification.

DETAILED DESCRIPTION

Embodiments of the present specification provide calibration methods for enhancing a sensing capability of one or more voltage sensing devices in presence of a plurality of conductors. Usually, when an electrical current flows through a conductor or the conductor is electrically charged, the conductor produces an electromagnetic field. This electromagnetic field of the conductor is typically proportional to electrical parameters (e.g., a voltage and/or current) of the conductor. Further, electromagnetic fields from one or more conductors present in a neighborhood of the conductor may undesirably influence sensed voltage values of the voltage sensing devices. Accordingly, the sensed voltage value of a given conductor may be contributed at least in part by a voltage value of the given conductor as well as voltage values of other conductors of the plurality of conductors.

This phenomenon of the voltage sensing devices being influenced by the electromagnetic fields of the conductors present in the neighborhood in addition to being effected by the electromagnetic fields of a conductor on which the voltage sensing device is mounted may be referred to as "cross-coupling." Further, it may be desirable to deduct at least in part or nullify the effect of the cross-coupling from the sensed voltage values to obtain a corrected voltage value of the conductor.

In certain embodiments, the cross-coupling may occur between a voltage sensing device and another conductor of a plurality of conductors. In particular, the cross-coupling may occur between the voltage sensing device and the other conductor when an electromagnetic field of the other conductor interferes or interacts with the voltage sensing device of the conductor. In certain embodiments, where the voltage sensing devices are contactless voltage sensing devices, one or more conductors of the plurality of conductors may employ respective one or more contactless voltage sensing devices. Further, in some of these embodiments the cross-coupling may exist between a given contactless voltage sensing device of a respective conductor of the plurality of conductors and other conductors of the plurality of conductors. These other conductors may be referred to as neighboring conductors. This cross-coupling between the contactless voltage sensing device and the neighboring conductors may undesirably affect a sensed voltage value of the given contactless voltage sensing device. Accordingly, it is desirable to at least partly remove the effect of the cross-coupling from the sensed voltage value of the given contactless voltage sensing device to obtain a voltage value of the respective conductor. Advantageously, the voltage value of the conductor thus obtained is a relatively more accurate representation of the voltage value of the conductor.

As used throughout the present specification, the term "conductor" refers to an electrical conductor. As used herein, the term "contactless" refers to absence of direct physical contact between the contactless voltage sensing device and a reference surface, and other conductors (e.g., other transmission lines in multi-phase transmission). In a particular example, the contactless voltage sensing device of the present specification may not be directly physically coupled to the ground to provide the reference potential. It may be noted that in some embodiments the reference surface may be a ground or a neutral conductor. However, in some other embodiments, the reference surface may be any other surface other than the ground, where the reference surface has a known potential, referred to as a "reference potential."

In certain embodiments, the calibration methods may be used to reduce effects of cross-coupling between corresponding antenna of the one or more contactless voltage sensing devices and neighboring conductors of the plurality of conductors. Further, the calibration methods may be used to reduce effects of parasitic impedances to further enhance the sensing capability of on an accuracy of the one or more contactless voltage sensing devices. In one example, each conductor of the plurality of conductors may be coupled to a respective contactless voltage sensing device. However, in another example, one or more conductors of the plurality of conductors may not be coupled to a contactless voltage sensing device.

In one example, the calibration methods may be used to at least partly reduce or nullify the effects of the cross-coupling between the contactless voltage sensing devices and multi-phase power lines. In a particular example, the multi-phase power lines may be three-phase distribution lines. Further, the multi-phase power lines may be a part of distribution network for electricity supply. As used herein, the terms "distribution line," "transmission line" and "power line" may be used interchangeably throughout the present specification.

In operation, the electromagnetic field that exists around a power line when the current flows through the power line may undesirably influence electronic components disposed in a surrounding environment of the power line. Accordingly, in case of multi-phase power lines, when each power line of the multi-phase power lines employs one or more contactless voltage sensing devices, each contactless voltage sensing device may be influenced by the electromagnetic field of the other power lines of the multi-phase power lines. By way of example, in case of three-phase power lines, where each of the three-phase power lines have a respective contactless voltage sensing device, the voltage value measured by each of the contactless voltage sensing devices may reflect a contribution from the three power lines, and not just from the respective power line to which the contactless voltage sensing device is coupled to measure the voltage value. Accordingly, it is desirable to measure an effect of the electric field generated by each power line on a voltage sensing device that is operatively coupled to a neighboring power line to facilitate calculation of a corrected voltage value of the power line. The methods of the present specification may be used for existing as well as future voltage sensing devices.

In certain embodiments, the contactless voltage sensing devices may be preferred due to ease of installation. By way of example, in case of the contactless voltage sensing devices it is not required to provide a physical contact between the sensing device and the ground. Accordingly, mounting the contactless voltage sensing device primarily entails physically coupling the contactless voltage sensing device on the body configured to carry current. For example, in case of the conductor being a power line, the contactless voltage sensing device may be clamped on to the power line. Further, advantageously, the contactless voltage sensing device is not influenced by presence or absence of physical objects between the ground and the sensor. Hence, it may be desirable to use the contactless voltage sensing devices. Further, since the contactless voltage sensing device is operatively coupled to a single power line of multi-phase power lines, hence, the contactless voltage sensing device does not interfere with the structure or the or layout of the power lines.

In certain embodiments, the contactless voltage sensing device may include a first impedance element having a first impedance and a second impedance element having a second impedance. The first and second impedances may be used to measure the voltage of the conductor. Non-limiting examples of the first impedance element may include one or more resistors, one or more capacitors, one or more inductors, or combinations thereof. In one example, the contactless voltage sensing device may include a capacitor as the first impedance element. In operation, the first impedance element is configured to sense an electrical parameter, such as the voltage of the conductor.

Further, the contactless voltage sensing device includes an antenna that is operatively coupled to the first impedance element. The antenna is configured to form the second impedance element in conjunction with the parasitic impedance element. In particular, the second impedance element is formed by the antenna and a parasitic impedance element, where the parasitic impedance element is formed between the antenna and the reference surface. An impedance of the second impedance element, also referred to as "second impedance," is a combination of an impedance of the parasitic impedance element, also referred to as "parasitic impedance," and an impedance of the antenna. Further, due to design of the contactless voltage sensing device, in some embodiments, the impedance of the antenna may be negligible compared to the parasitic impedance. In these embodiments, a value of the second impedance may be substantially similar to a value of the parasitic impedance. Accordingly, the second impedance may be substantially a parasitic impedance that appears between the antenna and the reference surface. In a non-limiting example, the parasitic impedance may primarily include a parasitic capacitance.

Further, in certain embodiments, the contactless voltage sensing device includes measurement and communication circuitry, where the measurement and communication circuitry is configured to measure a voltage of the conductor based on the voltage value sensed across the first impedance element. Further, in certain embodiments, the first impedance element may be disposed between a first node and a second node. Similarly, the antenna may be disposed between another first node and another second node. Moreover, the second node of the first impedance element may be operatively coupled to the first node of the antenna. In a particular example, the second node of the first impedance element and the first node of the antenna may be a common node between the first impedance element and the antenna. In operation, the first node of the first impedance element may be maintained at the same potential as that of the conductor. Maintaining the first node of the first impedance element at the same potential as that of the conductor enables the contactless voltage sensing device to measure the voltage of the conductor by enabling a voltage corresponding to the conductor to appear across the first impedance element. Further, the second node of the antenna may be configured to develop a voltage that is different from the voltage of the conductor. The voltage appearing on the second node of the antenna may be caused due to a current flowing through the parasitic impedance element. Consequently, the structure of the contactless voltage sensing device enables the combination of the first and second impedance elements to act as a voltage divider between the conductor and the reference surface. Due to this voltage division between the first and second impedance elements a voltage difference may be created across the first impedance element. Further, the measurement and communication circuitry may be configured to measure this voltage difference appearing across the first impedance element. In some embodiments, the measurement and communication circuitry may be configured to measure the voltage of the conductor based on the values of the first impedance, second impedance and voltage difference appearing across the first impedance element.

In certain embodiments, the contactless voltage sensing device includes an electrically conductive element configured to shield the first impedance element from electromagnetic radiation emanating from the conductor, such as a current carrying power line. Further, in some embodiments, the electrically conductive element may be maintained at the same voltage as that of the conductor.

Moreover, it may be noted that the antenna may be an electrically conductive body that has a first portion and a second portion. Further, an electrical insulator may be disposed on the first portion of the antenna to prevent electrical shorting of the electrically conductive body of the antenna with the electrically conductive element. Additionally, the second portion of the antenna may be disposed outside the electrical insulator as well as the electrically conductive element. The second portion of the antenna that is disposed outside the electrical insulator as well as the electrically conductive element may be exposed to the reference surface. Further, the second portion of the antenna in conjunction with the reference surface may contribute to formation of the second impedance and/or parasitic impedance. In certain embodiments, dimensions of the second portion of the antenna may be selected to facilitate relatively smaller values of antenna impedance as compared to parasitic impedance. The second portion of the antenna acts as the second node of the antenna.

In certain embodiments, the contactless voltage sensing device may be configured to communicate the measured voltage value to a determined location, such as, but not limited to, a control unit, a monitoring unit, a display unit, or combinations thereof. Further, the contactless voltage sensing device may be configured to communicate the measured voltage value using the measurement and communication circuitry. Advantageously, the contactless voltage sensing device may be configured to enable real-time monitoring of the voltage values of the conductor, such as, but not limited to, a power line.

Advantageously, measurement values of the contactless voltage sensing device are not undesirably or adversely affected by presence or absence of electrically conductive or electrically non-conductive objects that may be intentionally or unintentionally disposed between the contactless voltage sensing device and the reference surface while the contactless voltage sensing device is sensing and measuring the voltage values of the power line on which it is disposed. By way of example, the measured voltage value of a power line measured by the contactless voltage sensing device may not be adversely affected due to presence of an electrically conducting body, such as, but not limited to, a stationary or moving vehicle in the vicinity of the power line. Further, the contactless voltage sensing device is relatively easy to install as compared to conventional measurement devices that require a direct physical connection between the measurement device and the ground. In particular, the contactless voltage sensing device is configured to be mounted on the power line without any further need of the contactless voltage sensing device being physically coupled to the ground.

Additionally, one or more contactless voltage sensing devices may be configured to be employed in a monitoring system, where the monitoring system may include the control unit and/or the monitoring unit. The one or more contactless voltage sensing devices may be configured to communicate the measured voltage values of the conductor to the control unit and/or the monitoring unit. In some embodiments, the one or more contactless voltage sensing devices may include a plurality of data acquisition communicators (DACs). In some embodiments, the DACs may form part of the measurement and communication circuitry. In certain embodiments, data representative of the voltage of the power line is communicated by a DAC to the control unit, such as the control center computer, over a global system for mobile communication (GSM) link. This is an inexpensive and secure way of sending the data to the control unit, the monitoring unit, or any other control center computer or device.

Moreover, in some embodiments, the monitoring system may form part of an electricity network. Further, the electrical network may employ one or more monitoring systems. In some of these embodiments, the electricity network may employ a plurality of power lines, a plurality of contactless voltage sensing devices, and one or more monitoring systems. Further, one or more contactless sensing devices of the plurality of contactless voltage sensing devices may be operatively coupled to one or more monitoring systems. In one example, the monitoring system may be configured to communicate the measured voltage values to a control unit in the electricity network. In certain embodiments, the contactless voltage sensing devices may be configured to provide signals representative of the voltage value of a corresponding power line of the electricity network over a wide geographical area in a cost effective way. In one embodiment, each DAC of the plurality of DACs may have one or more contactless voltage sensing devices associated therewith so that the signals representative of the voltage values of the power lines may be transmitted from a contactless voltage sensing device to another contactless voltage sensing device or the control unit of the same or the other monitoring systems. In one example, the electrical properties transmitted from one DAC to the control unit may be transmitted to another DAC before being transferred to the control unit. By having a plurality of DACs, processing may be carried out either at the DACs or in the control unit. In one example, the signals may be amplified in the DAC and temporary storage of the data may be carried out in each DAC.

Further, the contactless voltage sensing device of the present specification may be easily adaptable to different dynamic ranges, bandwidths and sensitivity values. In one embodiment, the first impedance element may be modified to adapt the contactless voltage sensor for the different dynamic ranges, bandwidths and sensitivity values. By way of example, in instances where the first impedance element is a capacitor, a capacitor with higher capacitance may be used to obtain lower bandwidth, and vice versa. In one embodiment, a value of the first capacitance of the first impedance element may be equal to or more than about 1 nF. In the same or different embodiment, a value of the parasitic capacitance from the second impedance element may be less than or equal to about 0.01 pF.

Figure 1:
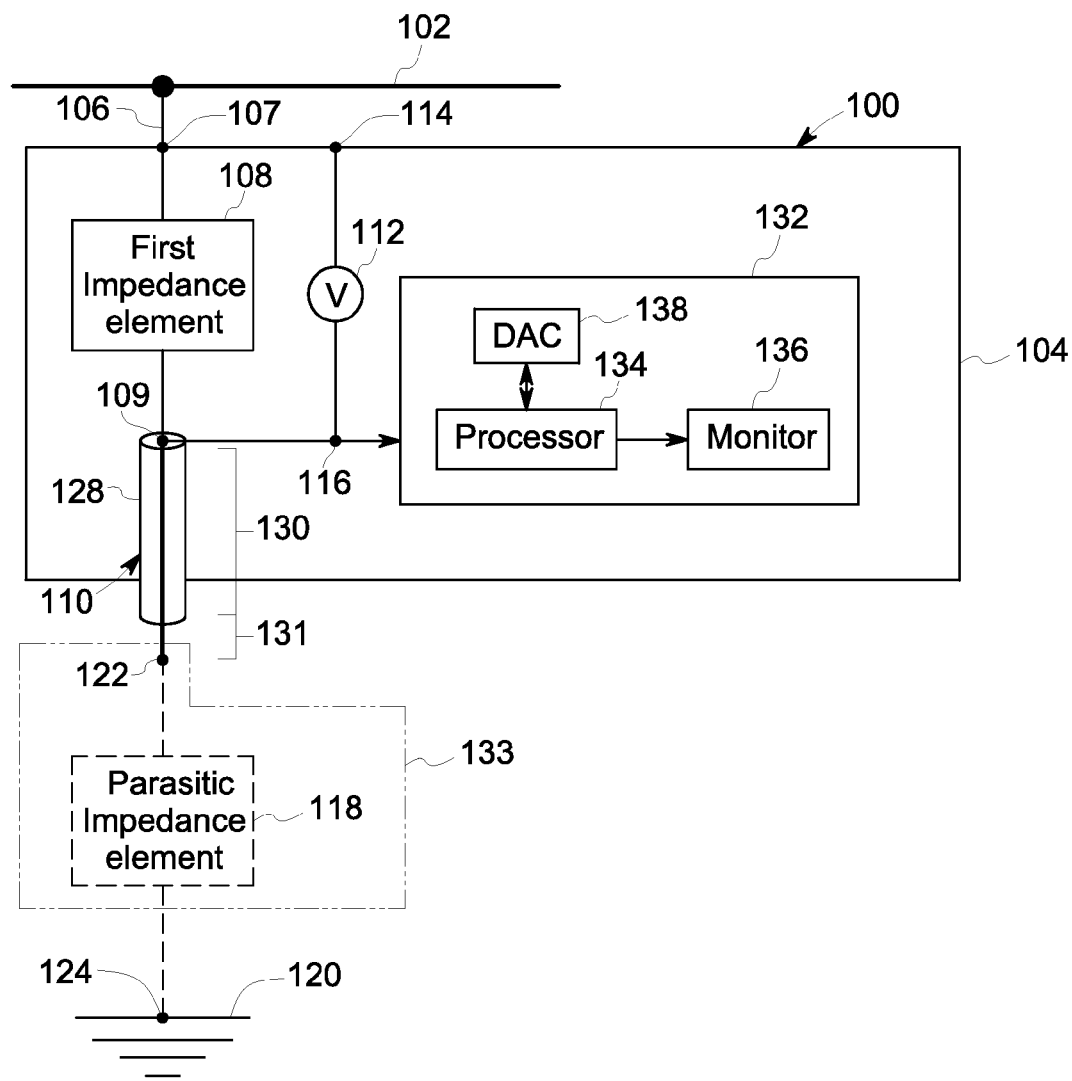
FIG. 1 is a schematic representation of an exemplary contactless voltage sensing device having an electrically conductive housing, in accordance with aspects of the present specification.

FIG. 1 illustrates an exemplary contactless voltage sensing device 100. The contactless voltage sensing device 100 may be configured to measure a voltage value of a conductor, such as, but not limited to, a power line 102 with respect to a reference surface 120. The power line 102 may be a high voltage line, a medium voltage line, or any other power line or any other electrical conductor that is configured to carry electrical current. In certain embodiments, the contactless voltage sensing device 100 includes an electrically conductive element in the form of an electrically conductive housing 104. The electrically conductive housing 104 may be configured to shield one or more components of the contactless voltage sensing device 100 from electromagnetic radiation of the power line 102. Further, the electrically conductive housing 104 may provide shielding to one or more sides of the contactless voltage sensing device 100. In some embodiments, the electrically conductive housing 104 may be maintained at the same voltage as the power line 102. In one embodiment, the electrically conductive housing 104 may be shunted to the power line 102 using an electrically conductive connector 106. Maintaining the electrically conductive housing 104 at the same potential as the power line 102 may facilitate reduction in interference otherwise caused due to presence of the electrical field around the electronic components of the contactless voltage sensing device 100. Further, maintaining the electrically conductive housing 104 at the same potential as that of the power line 102 enhances accuracy of measurement of the contactless voltage sensing device 100.

In the illustrated embodiment, the contactless voltage sensing device 100 further includes a first impedance element 108 disposed between a first node 107 and a second node 109. In some embodiments, the first impedance element 108 may include a capacitor, a resistor, an inductor, or combinations thereof. Further, the first impedance element 108 may have an impedance that is referred to as a "first impedance," hereinafter. The first impedance element 108 is configured to sense at least one electrical parameter of the power line 102. By way of example, a voltage appearing across the first impedance element 108 is representative of the sensed electrical parameter of the power line 102. The first impedance element 108 is connected to the power line 102 at the first node 107.

Further, the first impedance element 108 is operatively coupled to an antenna 110 at the second node 109. The second node 109 is a common node shared between the first impedance element 108 and the antenna 110. Further, the voltage appearing across the first impedance element 108 is representative of the voltage difference that exists between the power line 102 and the second node 109. In embodiments where the electrically conductive housing 104 is maintained at the same voltage as that of the power line 102, the voltage difference between the power line 102 and the second node 109 is the same as the voltage difference between the electrically conductive housing 104 and the second node 109. Accordingly, the voltage difference across the first impedance element 108 may be measured by disposing a voltage sensing device, such as a voltmeter 112, between nodes 114 and 116.

Further, the antenna 110 includes a first portion 130 and a second portion 131. It may be noted that the first and second portions 130 and 131 of the antenna 110 may not be physically different entities. The first portion 130 of the antenna 110 may be the portion of the antenna 110 that is insulated from the electrically conductive housing 104 using an electrical insulator 128. Further, the second portion 131 of the antenna 110 may be the portion that is disposed outside the electrical insulator 128. Further, the second portion 131 of the antenna 110 may be disposed outside the electrically conductive housing 104. Further, the second portion 131 of the antenna 110 may be exposed to the reference surface 120, generally represented by a node 124. In certain embodiments, the node 122 of the antenna 110 is formed on the second portion 131 of the antenna 110. In particular, the antenna 110 is disposed between the node 109, which is the first node of the antenna 110 and a node 122, which is the second node of the antenna 110. Further, the second portion 131 of the antenna 110 is exposed outside the electrical insulator 128.

In the illustrated embodiment, the contactless voltage sensing device 100 includes a second impedance element 133 that is formed by at least a portion of the antenna 110 and a parasitic impedance element 118. In particular, the second impedance element 133 is formed by the second portion 131 of the antenna 110 and the parasitic impedance element 118. Further, the parasitic impedance element 118 is disposed between the antenna 110 and the reference surface 120. In particular, the parasitic impedance element 118 exists between the node 122 of the antenna 110 and the node 124 representative of the reference surface 120. An impedance value of the second impedance element 133 may be referred to as a second impedance. It may be noted that the second impedance is a combination of a parasitic impedance and an impedance of the antenna. Further, it may be noted that the second impedance may be substantially similar to the parasitic impedance as a value of the impedance of the antenna may be substantially lower compared to a value of the parasitic impedance.

Further, in embodiments where the reference surface is a ground, the parasitic impedance may be defined as the parasitic capacitance between the antenna 110 and the ground. However, in other embodiments where the reference surface 120 is a surface different from the ground, the parasitic capacitance may be defined as an impedance between the antenna 110 and a reference potential, where the reference potential is a potential of the reference surface 120.

Additionally, in embodiments where at least a portion of the antenna 110 is disposed in the electrical insulator 128, the overall size of the antenna 110 may not matter, however, only the second portion 131 of the antenna that is disposed outside the electrical insulator 128 may contribute to the parasitic impedance. In some embodiments, a length of the second portion 131 may be up to about 10 cm. Accordingly, it may be desirable to provide the antenna 110 having relatively small dimensions of the second portion 131 to provide relatively high parasitic impedance for the parasitic impedance element. It may be noted that high parasitic impedance or low parasitic capacitance enables the contactless voltage sensing device to be not undesirably influenced by changes in surrounding conductors. Consequently, the increased parasitic impedance renders the contactless voltage sensing device 100 relatively less prone to fluctuations in the surrounding conductors while still maintaining physical separation between the contactless voltage sensing device 100 and the reference surface 120. Further, in some embodiments, the antenna 110 may be a cable, a wire, a plate, a patterned elongated structure, an impedance element, or combinations thereof. In one embodiment, the antenna 110 may include a lumped impedance element. By way of example, the antenna 110 may be a lumped capacitor, where a first terminal of the capacitor is disposed in the electrical insulator 128 and a second terminal of the lumped capacitor is exposed to the reference surface 120.

Further, it may be noted, that the voltage difference ($V_1$) between the nodes 107 and 109 of the first impedance element 108 may appear primarily because of the impedance divider action caused due to the presence of the antenna 110 between the first impedance element 108 and the reference surface 120. In particular, presence of the antenna 110 results in the formation of the second impedance element 133, thereby providing the divided impedance. In one example where the antenna impedance is assumed to be negligible compared to the parasitic impedance, and where the first impedance element 108 is a capacitor, the antenna 110 may result in the formation of the parasitic capacitor. Further, in this example, the first impedance element 108 or the capacitor may act as a voltage divider between the power line 102 and the reference surface 120.

In one embodiment, the second impedance may be at least about 50 times higher than the value of the first impedance. In another embodiment, the second impedance may be at least about 100 times higher than the value of the first impedance. In yet another embodiment, the second impedance is about 100 to 10,000 times higher than the value of the first impedance. In some embodiments, the second impedance may have a relatively high value by virtue of having a high parasitic impedance, a high antenna impedance, or both. In some other embodiments, the second impedance may have a relatively high value by virtue of having a high parasitic impedance. While the value of the first impedance is primarily governed by the type of device that is used as the first impedance element, the parasitic impedance is primarily governed by the size of the antenna 110. Further, the value of the antenna impedance may be governed by the impedance element used to form the antenna 110. In order to have a relatively low value for the first impedance, in some embodiments, a lumped capacitor may be used as the first impedance element 108.

In some embodiments, the voltage in the power line 102 may be calculated using the value of the first impedance, second impedance, and the voltage difference across the first impedance element 108. The voltage of the power line may be represented by Equation (1)

$$V_L = \frac{Z_1 + Z_2}{Z_1} * V_0 \qquad \text{Equation (1)}$$

where $V_L$ represents voltage of the power line 102 with respect to reference surface 120, $V_o$ represents voltage difference across the first impedance element, $Z_1$ represents the first impedance value, and $Z_2$ represents the second impedance value. The voltage value across the first impedance element 108 may be governed by the voltage of the power line 102, however, the value of the second impedance may be governed by the antenna impedance, size of the antenna 110 disposed outside the electrical insulator 128, and the distance between the antenna 110 and the reference surface 120. It is desirable to have minimum variation in the value of the parasitic impedance. Due to the small size of the antenna 110, the value of the parasitic impedance is relatively high. Hence, advantageously, the variation in the estimated value of the voltage ($V_L$) of the power line 102 is minimized. Accordingly, presence of conductors or other objects between the contactless voltage sensing device 100 and the ground 120 does not adversely affect the measurement of the voltage values in the power line 102.

In certain embodiments, the output of the voltmeter 112 may be operatively coupled to measurement and communication circuitry 132. In some embodiments, the measurement and communication circuitry 132 may include a processor 134, a monitor 136 and a DAC 138. The measurement and communication circuitry 132 is configured to measure the voltage difference across the first impedance element 108. Further, the processor 134 of the measurement and communication circuitry 132 is configured to determine a voltage value of the power line 102 based on the value of the first impedance, a value of the voltage appearing across the first impedance element 108 and the value of the second impedance. Further, the determined value of the corrected voltage of the power line 102 may be wirelessly communicated to other contactless voltage sensing devices (not shown) or a control unit using the DAC 138

Also, the functions of the processor 134 may be implemented in a variety of programming languages, including but not limited to Ruby, Hypertext Pre-processor (PHP), Perl, Delphi, Python, C, C++, or Java. Such code may be stored or adapted for storage on one or more tangible, machine-readable media, such as on data repository chips, local or remote hard disks, optical disks (that is, CDs or DVDs), solid-state drives, or other media, which may be accessed by the processor-based system to execute the stored code.

In one embodiment, the measurement and communication circuitry 132 may be a high input impedance circuitry. The measurement and communication circuitry 132 may be configured to use the values of the first impedance and the parasitic impedance to determine the corrected voltage value of the power line 102. In the illustrated embodiment, the measurement and communication circuitry 132 may be disposed in the electrically conductive housing 104. However, in an alternate embodiment not illustrated here, the measurement and communication circuitry 132 may be disposed outside the electrically conductive housing 104.

The measurement and communication circuitry 132 is communicatively coupled to other devices, such as a control unit (not shown), or other contactless voltage sensing devices using the DAC 138. In one embodiment, the control unit may be configured to receive data representative of the voltage value of the power line 102 from the one or more contactless sensing devices 100.

In some embodiments, the measurement and communication circuitry 132 may be configured to provide a determined voltage value of the power line 102 to the control unit. In one embodiment, the measurement and communication circuitry 132 may be configured to communicate with the control unit using a DAC 138 or a radio transmitter/receiver. In certain embodiments, the contactless voltage sensing device 100 may be a remote sensing device. The term "remote sensing device" may be used to refer to a sensing device that is communicatively coupled to a monitoring unit and/or a control unit while being located in a remote location with respect to the monitoring unit and/or the control unit. In one embodiment, the remote sensing device may be wirelessly coupled to the monitoring unit and/or the control unit.

Moreover, although not illustrated, the contactless voltage sensing device 100 may include a protective cover or casing that is disposed around at least a portion of the electrically conductive housing 104. The protective cover may be made of electrically non-conductive materials, such as but not limited to, electrically non-conductive polymers or electrically non-conductive ceramics. Further, in one embodiment, the protective cover may be configured to provide mechanical strength and/or environmental protection to the contactless voltage sensing device 100.

Figure 2:
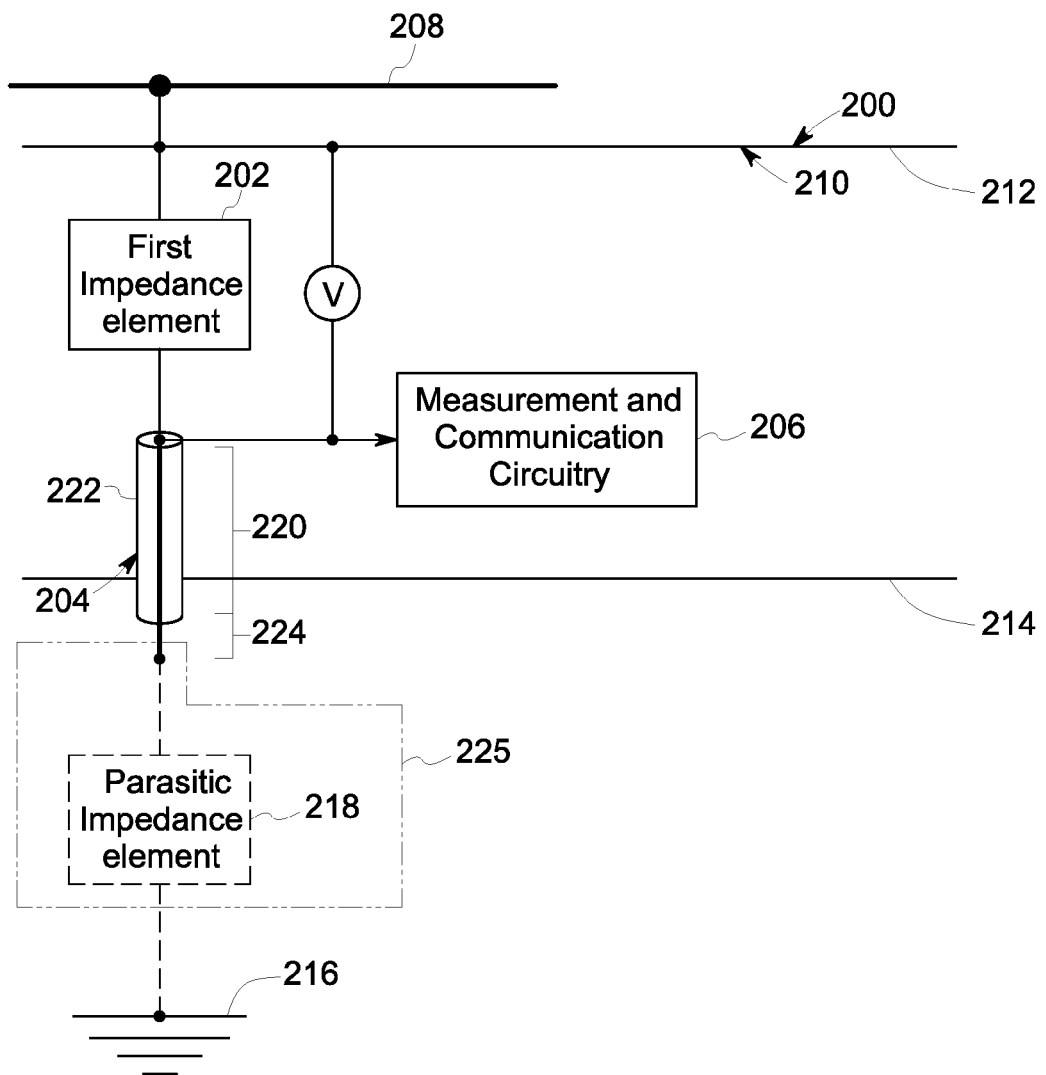
FIG. 2 is a schematic representation of an exemplary contactless voltage sensing device having an electrically conductive shield, in accordance with aspects of the present specification.

FIG. 2 illustrates an alternate embodiment of the contactless voltage sensing device 100 of FIG. 1. In the illustrated embodiment, the contactless voltage sensing device 200 is operatively coupled to a power line 208 and configured to measure a voltage of the power line 208. The contactless voltage sensing device 200 includes a first impedance element 202, an antenna 204 and measurement and communication circuitry 206. The contactless voltage sensing device 200 may be configured to be mounted on the power line 208. Further, the contactless voltage sensing device 200 may include an electrically conductive element in the form of an electrically conductive shield 210. The electrically conductive shield 210 includes a first portion, namely a first electrically conductive shield 212, and a second portion, namely a second electrically shield 214. The first electrically conductive shield 212 of the electrically conductive shield 210 is disposed between the first impedance element 202 and the power line 208. Accordingly, the first electrically conductive shield 212 is configured to shield the contactless voltage sensing device 200 from the electromagnetic radiation from the power line 208. Further, the second electrically conductive shield 214 of the electrically conductive shield 210 is disposed between the antenna 204 and a reference surface 216. The second electrically conductive shield 214 is configured to prevent any electrical interference between the reference surface 216 and the first impedance element 202. Further, the second electrically conductive shield 214 may be configured to enable the formation of a second impedance element 225. In particular, the second impedance element 225 may be formed in part by the antenna 204 and a parasitic impedance element 218. Further, the parasitic impedance element 218 may be disposed between the antenna 204 and the reference surface 216.

Further, the antenna 204 includes a first portion 220, a second portion 224 and an electrical insulator 222. The first portion 220 of the antenna 204 may be disposed in the electrical insulator 222, whereas the second portion of the antenna second 204 may be disposed outside the electrical insulator 222. The second portion 224 of the antenna 204 may be disposed on the same side of the second electrically conductive shield 214 as the reference surface 216. The second portion 224 of the antenna 204 in conjunction with the reference surface 216 may form the parasitic impedance element 218.

Further, the first and second electrically conductive shields 212 and 214 may both be maintained at the same electrical potential as that of the power line 208. Although not illustrated in certain embodiments, the electrically conductive shield 210 may include only one of the first or second electrically conductive shields 212 and 214. In one example, the electrically conductive shield 210 may include only the first electrically conductive shield 212.

Figure 3:
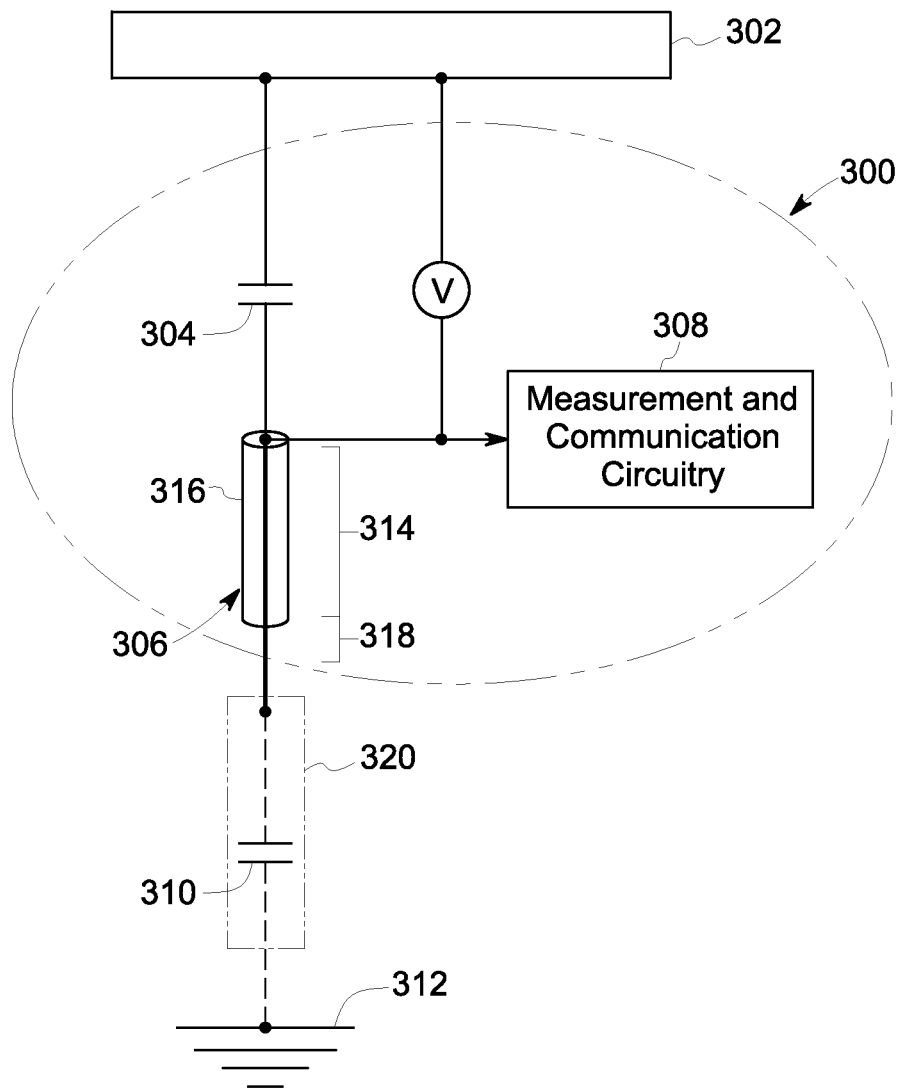
FIG. 3 is a schematic representation of an exemplary contactless voltage sensing device having an antenna, where at least a portion of the antenna is electrically insulated, in accordance with aspects of the present specification.

FIG. 3 illustrates a contactless voltage sensing device 300 configured to measure a voltage value of a conductor 302 with respect to a reference surface 312. The contactless voltage sensing device 300 includes a first impedance element, such as a capacitor 304, an antenna 306 and measurement and communication circuitry 308. The measurement and communication circuitry 308 is configured to measure a voltage value based on one or more electrical parameters sensed by the capacitor 304 and a second impedance element 320. In the illustrated embodiment, it is assumed that an antenna impedance is substantially low than a parasitic capacitance. Accordingly, the parasitic capacitance is substantially similar to the second impedance. Further, the parasitic capacitance may be sensed across a parasitic capacitor 310 formed between the antenna 306 and the reference surface 312. In the illustrated embodiment, the capacitor 304 is shown as a single or lumped capacitor, however, in an alternative embodiment; a plurality of capacitors may be used to replace the capacitor 304. In some of these embodiments, the plurality of capacitors may be electrically coupled to effectively form a lumped capacitor. Further, the antenna 306 may include a portion 314 that is disposed within an electrical insulator 316, and a portion 318 that is disposed outside the electrical insulator 316. The portion 318 disposed outside the electrical insulator 316 forms a parasitic capacitor 310 in conjunction with the reference surface 312.

Figure 4:
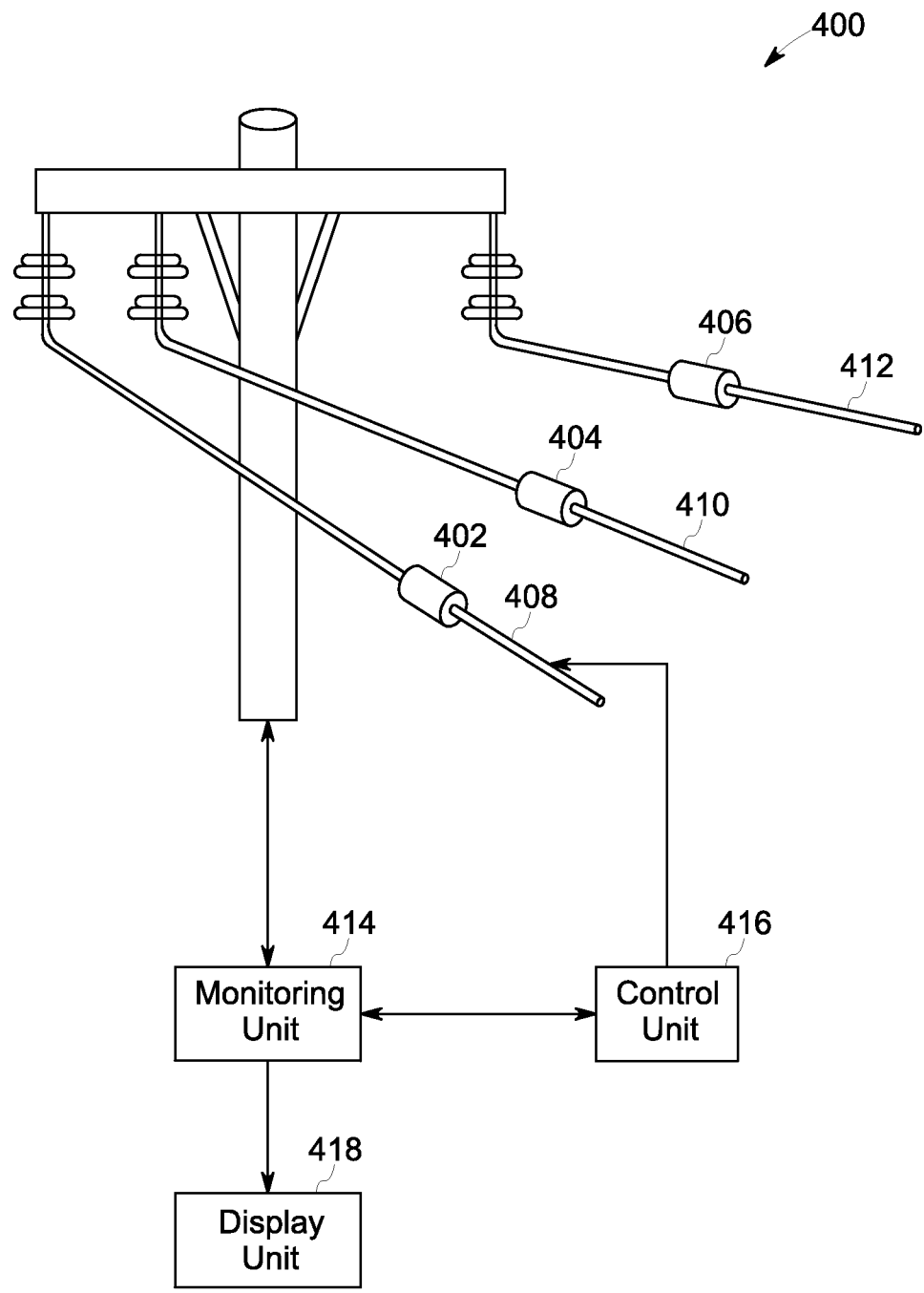
FIG. 4 is a schematic representation of an exemplary monitoring system employing a contactless voltage sensing device, in accordance with aspects of the present specification.

FIG. 4 illustrates an exemplary embodiment of a monitoring system 400 employed in an electricity network in accordance with aspects of the present specification. In the illustrated embodiment, power lines 408, 410 and 412 may be operatively coupled to a common electric pole to form part of a larger electricity network. The monitoring system 400 includes 3 contactless voltage sensing devices 402, 404 and 406 disposed on their respective power lines 408, 410 and 412, respectively. The contactless voltage sensing devices 402, 404 and 406 may individually measure the voltages on their respective power lines 408, 410 and 412. Once the voltage values have been measured the contactless voltage sensing devices 402, 404 and 406 may communicate the measured voltage values to a monitoring unit 414, such as a central computer. In instances where the contactless voltage sensing devices 402, 404 and 406 communicate with the monitoring unit 414, the monitoring unit 414 may be configured to transmit the data to a control unit 416 to perform required steps, when required. By way of example, in case a fluctuation or drop or rise is monitored in the voltage values of one or more power lines 408, 410 and 412, the corresponding contactless voltage sensing devices 402, 404 and 406 may communicate with the monitoring unit 414 to transmit the data to a control unit 416 to perform corrective measures.

In certain embodiments, each contactless sensing device 402, 404 and 406 may include a corresponding processor (not shown in FIG. 4). In some of these embodiments, the corresponding processors may be configured to communicate with each other. In this way, the processing of the measured voltage may be carried out at each of the contactless voltage sensing devices 402, 404 and 406 which reduces the computational overhead requirement of the control unit 416 and may further enhance the efficiency of the monitoring system 400. Further, in addition to individual processors of the contactless voltage sensing devices 402, 404 and 406, the monitoring system 400 may include a processor unit (not shown in FIG. 4) disposed between one or more of the contactless voltage sensing devices 402, 404 and 406 and the monitoring unit 414 or the control unit 416. The processor unit may be configured to process the data received from the contactless voltage sensing devices 402, 404 and 406 before transmitting the data to the monitoring unit 414 or the control unit 416. Alternatively, in some other embodiments, the monitoring system 400 may include a common processor unit between the contactless sensing devices 402, 404 and 406 for processing the measured electrical signals from the one or more contactless voltage sensing devices 402, 404 and 406 and transmitting the processed data to the control unit 416.

In some embodiments, the monitoring unit 414, the control unit 416, or both may be configured to store the requested information in a storage repository (not shown). In one embodiment, the storage repository may include devices such as a hard disk drive, a floppy disk drive, a compact disk-read/write (CD-R/W) drive, a Digital Versatile Disc (DVD) drive, a flash drive, and/or a solid-state storage device.

Further, in certain embodiments, the monitoring system 400 may include a display unit 418. In some embodiments, the display unit 418 may form part of the monitoring unit 414 or the control unit 416. In certain embodiments, two or more contactless voltage sensing devices 402, 404 and 406 may be disposed along a length of the power lines 408, 410 and 412.

In a non-limiting example, a distance between any two adjacent contactless voltage sensing devices disposed on the same power line may be about 1 kilometer. Further, distances between any two adjacently disposed contactless voltage sensing devices 402, 404 and 406 may be same or different for the same power line. Data representative of the voltage of the power line from one or more contactless voltage sensing devices 402, 404 and 406 may be measured and/or processed by one or more monitoring units 418 before being sending the data to the control unit 416. In one embodiment, the data may be transmitted from the contactless voltage sensing device to one or more monitoring units 418 via a DAC (not shown), where the DAC may form part of the contactless voltage sensing devices 402, 404 and 406. In some embodiments, the monitoring system 400 may include an additional DAC unit in addition to the individual DAC units corresponding to the contactless voltage sensing devices 402, 404 and 406. In these embodiments, the DAC unit may be configured to execute calculations on the data received from one or more contactless voltage sensing devices 402, 404 and 406 to estimate the overall state of the power lines 408, 410 and along the length of the power lines 408, 410 and 412. In some of these embodiments, the DAC unit may form part of the individual processors or the common processor unit to process the data representative of the electrical properties of the power line, prior to transmitting the data onwards to the control unit 416. In this way, the computation may be carried out in each of the DACs which may help in simplifying the construction of the individual measurement sensors. Depending on the line conditions of the power lines 408, 410 and 412 and the distribution of branches and loads on the line, various combinations of contactless voltage sensing devices 402, 404 and 406 may be employed on the power lines 408, 410 and 412.

In certain embodiments, the one or more contactless voltage sensing devices 402, 404 and 406 may be configured to be powered directly from the power line upon which it is mounted. Further, in one embodiment, the one or more contactless voltage sensing devices 402, 404 and 406 may be configured to draw operating power directly from a magnetic field of the power line.

Further, it may be noted that the DACs of the individual contactless voltage sensing devices 402, 404 and 406 may or may not be in direct communication link with the control unit 416 or the monitoring unit 414. Moreover, any number of repeater units or other monitoring units may be used to repeat the signal from the contactless voltage sensing devices 402, 404 and 406 en route to the control unit 416.

Further, the position of each of the contactless voltage sensing devices 402, 404 and 406 may be obtained using standard global positioning systems (GPS), for example, during installation of the contactless voltage sensing devices 402, 404 and 406. This may then in turn be used in whole or in part as the address of that particular contactless voltage sensing device. The position of the contactless voltage sensing devices 402, 404 and 406 may be used to direct engineers to the particular contactless voltage sensing device to further facilitate the ability of the service personnel to determine the location of a fault. Moreover, the measurements obtained from the different power lines may be time-synchronized. In some embodiments, the GPS signals may be used for time synchronizing the measurements across the contactless voltage sensing devices 402, 404 and 406.

In case of three phase lines, the contactless voltage sensing devices may be disposed on one or more of the three phase lines. In an example embodiment, voltage values from the three phase lines as sensed by the contactless voltage sensing devices may be summed using complex arithmetic. In certain embodiments, if a fault condition exists on a power line, current and voltage values of the power line may be used to determine a location of the fault on the power line. In some embodiments, the voltage sensor of the present specification may be integrated with a current sensor. In these embodiments, the integrated sensor may be used to provide both the current and voltage values to determine the location of the fault on the power line.

Once the fault location or the fault condition is identified, in some embodiments, repair personnel may be alerted using a mobile communication device, such as, but not limited to, a cell phone, a pager, and it will be understood that various other methods of altering the repair personnel such as by GSM network may be used.

Furthermore, it may be noted that in some embodiments, each contactless voltage sensing device may be electrically isolated from the reference surface (e.g., a ground) and therefore may be relatively simple to install on a power line. Various different measurements may be taken from the overhead power lines by the addition of further measurement equipment.

Additionally, in certain embodiments, one or more contactless voltage sensing devices may be configured to be powered directly from the power line upon which it is mounted. By way of example, the one or more contactless voltage sensing devices may be configured to draw operating power directly from the magnetic field of the power line.

In certain embodiments, the plurality of conductors may be disposed in a determined geometry. In a particular embodiment, the neighboring conductors may be disposed in a determined geometry with respect to a conductor of the plurality of conductors having the contactless voltage sensing device. Non-limiting examples of the determined geometry may include a distance between two or more conductors of the plurality of conductors, a relative orientation of the conductors, a layout of the conductors, cross-section of the conductors, or combinations thereof. In one embodiment, the plurality of conductors may be disposed parallel to one another. In another embodiment, the layout of three power lines of the three-phase power lines may be triangular (see FIG. 5). Further, in this embodiment, the distance between any two conductors may be similar to distance between any other two conductors.

Moreover, the cross-coupling between the contactless voltage sensing device and the neighboring conductors may be at least partly dependent on relative locations or geometries of the contactless voltage sensing device with respect to the neighboring conductors. Additionally, the cross-coupling between the contactless voltage sensing device and the neighboring conductors may be at least partly dependent on relative locations or geometries of the contactless voltage sensing device with respect to the electrically conductive shields of contactless voltage sensing devices of the neighboring conductors. Further, the cross-coupling may also be dependent on physical dimensions of the antenna. By way of example, an antenna having relatively large size of the antenna may exhibit a relatively high cross-coupling with neighboring conductors. In particular, the antenna having a relatively large second portion, that is, the portion disposed outside the electrical conductor, may exhibit a relatively high cross-coupling with the neighboring conductors. Accordingly, the antenna with the larger second portion may have undesirably lower parasitic impedance or undesirably higher parasitic capacitance.

Additionally, as discussed hereinabove, in operation, as a result of cross-coupling voltage values sensed by a particular contactless voltage sensing device for a given conductor may not be an accurate representation of the corrected voltage value of the respective conductor. Moreover, in some embodiments, a relationship between corrected voltage values of the conductors and the sensed voltage values of the conductors may be expressed in a matrix relation.

Moreover, advantageously, due to the design of the contactless voltage sensing device the first impedance may be substantially lower and the second impedance or the parasitic impedance may be relatively larger. This relatively large parasitic impedance to the reference surface may remain relatively unperturbed by small impedance changes in the surrounding. Accordingly, the calibration methods may not be undesirably influenced by changes in the surrounding. Non-limiting examples of such changes may include presence of a conductor, other than the plurality of conductors. Further, it may be noted that in certain embodiments, a cross-coupling factor in sensed voltage values of the contactless voltage sensing device is substantially constant irrespective of the surrounding conditions which would be varying from place to place. Thus, as the cross-coupling factors do not vary with environmental and ambient conditions, these cross-coupling factors may be determined for a particular setting, such as, but not limited to, a lab setting. Further, the contribution of the cross-coupling may be at least partly deducted from the sensed voltage values using the cross-phase coupling factors. In one embodiment, the cross-coupling factors may be determined using a matrix relation between the sensed voltage values from the contactless voltage sensing device and corrected voltages of the conductors.

FIG. 5 illustrates a schematic representation 500 of cross-coupling between antennae 502, 504 and 506 of contactless voltage sensing devices 508, 510 and 512 and neighboring conductors of the contactless voltage sensing devices 508, 510 and 512. In particular, the cross-coupling may take place between the second portions (i.e., the portions disposed outside the electrical insulators) of the antennae 502, 504 and 506 of the contactless voltage sensing devices 508, 510 and 512 and the neighboring conductors of the contactless voltage sensing devices 508, 510 and 512. In the illustrated embodiment, reference numerals 508, 510 and 512 are representations of the contactless voltage sensing devices. Moreover, the contactless voltage sensing device 508 is operatively coupled to a conductor 532, the contactless voltage sensing device 510 is coupled to a conductor 534, and the contactless voltage sensing device 512 is operatively coupled to a conductor 536. The illustrated embodiment represents a multi-phase power lines arrangement, where the conductors 532, 534 and 536 may be three power lines of a three-phase power lines arrangement. In certain embodiments, the calibration methods of the present specification may be employed to determine individual voltage values of the conductors 532, 534 and 536.

Further, the contactless voltage sensing device 508 includes a first impedance element 514, a second impedance element (not shown in FIG. 5) having a second impedance, and the antenna 502. Moreover, the first impedance element 514 has a first impedance ($Z_{11}$). Further, the second impedance element is formed in part by the antenna 502 and a parasitic impedance element 516 having a parasitic impedance. As discussed hereinabove, the second impedance is substantially similar to the parasitic impedance ($Z_{p1}$). Similarly, the contactless voltage sensing device 510 includes a first impedance element 520, a second impedance element (not shown) having a parasitic impedance element 522, and the antenna 504. Further, the first impedance element 520 has a first impedance ($Z_{22}$), and the parasitic impedance element 522 has a parasitic impedance ($Z_{p2}$). Likewise, the contactless voltage sensing device 512 includes a first impedance element 524, a second impedance element having a parasitic impedance element 526, and the antenna 506. Further, the first impedance element 524 has a first impedance ($Z_{33}$), and the parasitic impedance element 526 has a parasitic impedance ($Z_{p3}$). Additionally, as discussed hereinabove, the second impedances of the contactless voltage sensing devices 508, 510 and 512 are substantially similar to respective parasitic impedances.

Additionally, although not illustrated in the embodiment of FIG. 5, each of the contactless voltage sensing devices 508, 510 and 512 may further include respective measurement and communication circuitry configured to measure voltage values of the respective conductors 532, 534 and 536. In one embodiment, the voltage value of a respective conductor may be measured based on the value of the first impedance, the value of the second impedance, and the value of the voltage appearing across the first impedance element. Further, a reference surface is represented by reference numeral 530. The reference surface 530 may be same or different for the different contactless voltage sensing devices 508, 510 and 512. In one embodiment, the reference surface 530 may be a ground. It may be noted that in the illustrated embodiment the conductors 532, 534 and 536 are disposed parallel to each other in a triangular layout. Further, the conductors 532, 534 and 536 are disposed at similar distance from one another. Moreover, it may be noted that in other embodiments, the conductors may be disposed in other geometrical layouts other than the triangular layout.

In the illustrated embodiment, a dashed line 540 represents cross-coupling between the antenna 502 of the contactless voltage sensing device 508 and the neighboring conductor 534 of the contactless voltage sensing device 508. Further, the reference numeral 542 represents a parasitic impedance ($Z_{12}$) due to the cross-coupling 540. Similarly, a dashed line 544 represents cross-coupling between the antenna 502 of the contactless voltage sensing device 508 and the neighboring conductor 536 of the contactless voltage sensing device 508. Further, the reference numeral 546 represents a parasitic impedance ($Z_{13}$) due to the cross-coupling 544.

Similarly, a dashed line 548 represents cross-coupling between the antenna 504 of the contactless voltage sensing device 510 and the neighboring conductor 532 of the contactless voltage sensing device 510. Further, the reference numeral 550 represents a parasitic impedance ($Z_{21}$) due to the cross-coupling 548. Similarly, a dashed line 552 represents cross-coupling between the antenna 504 of the contactless voltage sensing device 510 and the conductor 536. Further, the reference numeral 554 represents a parasitic impedance ($Z_{23}$) due to the cross-coupling 552.

Further, a dashed line 556 represents cross-coupling between the antenna 506 of the contactless voltage sensing device 512 and the neighboring conductor 532 of the contactless voltage sensing device 512. Further, the reference numeral 558 represents a parasitic impedance ($Z_{31}$) due to the cross-coupling 556. Similarly, a dashed line 560 represents cross-coupling between the antenna 506 of the contactless voltage sensing device 512 and the conductor 534. Further, the reference numeral 562 represents a parasitic impedance ($Z_{32}$) due to the cross-coupling 560.

In certain embodiments, a voltage of the conductor 532 may be represented as $V_{L1}$. Similarly, the voltage of the conductor 534 may be represented as $V_{L2}$, and the voltage of the conductor 536 may be represented as $V_{L3}$. Further, voltage across the first impedance element 514 of the contactless voltage sensing device 508 is the sensed voltage value of the conductor 532 and may be represented as $V_{Z1}$. Moreover, the voltage across the first impedance element 520 of the contactless voltage sensing device 510 is the sensed voltage value of the conductor 534 and may be represented as $V_{Z2}$. Similarly, the voltage across the first impedance element 524 of the contactless voltage sensing device 512 is the sensed voltage value of the conductor 536 and may be represented as $V_{Z3}$.

In certain embodiments, if $V_{LX}$ is a voltage of a distribution line X, and $V_{ZX}$ is a measured or sensed value of the voltage for the distribution line X, and 1, 2 and 3 represent three phases, and [M] is a calibration matrix, a relationship between corrected power line voltages ($V_{LX}$) and sensed voltage values ($V_{ZX}$) may be represented in a matrix relation ($V_{LX}$=[M] $V_{ZX}$ or $V_{LX}$=[L]$^{-1}$ $V_{ZX}$). Equation (2) shows a matrix relation (i.e., L $V_{LX}$=$V_{ZX}$) for three-phase power lines. Further, calibration matrix [M] is an inverse of matrix [L].

$$\begin{bmatrix} L_{11} L_{12} L_{13} \\ L_{21} L_{22} L_{23} \\ L_{31} L_{32} L_{33} \end{bmatrix} \begin{bmatrix} V_{L1} \\ V_{L2} \\ V_{L3} \end{bmatrix} = \begin{bmatrix} V_{Z1} \\ V_{Z2} \\ V_{Z3} \end{bmatrix} \quad \text{Equation (2)}$$

Further, as represented by Equation (3), calibration matrix [M] is an inverse of matrix [L].

$$\begin{bmatrix} M_{11} M_{12} M_{13} \\ M_{21} M_{22} M_{23} \\ M_{31} M_{32} M_{33} \end{bmatrix} = \begin{bmatrix} L_{11} L_{12} L_{13} \\ L_{21} L_{22} L_{23} \\ L_{31} L_{32} L_{33} \end{bmatrix}^{-1} \quad \text{Equation (3)}$$

Further, it may be noted that the individual matrix elements are contributed by parasitic impedance and cross-coupling phenomenon between an antenna of a given contactless voltage sensing device and (1) the neighboring conductors, and/or (2) electrically conductive shields of the contactless voltage sensing devices of the neighboring conductors. As mentioned hereinabove, due to the cross-coupling, the voltage appearing across the first impedance elements 514, 520 and 524 of the contactless voltage sensing devices 508, 510 and 512 are influenced by the voltages of the neighboring conductors. Accordingly, by way of example, the voltage, $V_{Z1}$, appearing across the first impedance element 514 of the voltage sensing device 508 may be represented by Equation (4) which is a modified form of equation $V_{Z1} = L_{11} V_{L1} + L_{12} V_{L2} + L_{13} V_{L3}$.

It may be noted that primarily the term $1/Z_{11}$, represents the inverse of first impedance and has a relatively large value as compared to $1/Z_{12}$, $1/Z_{13}$ or $1/Z_{P1}$. Accordingly, in one embodiment, the denominator in the coefficients of $V_{L1}$, $V_{L2}$ and $V_{L3}$ may be approximated to be equal to about $1/Z_{11}$.

Moreover, sensed voltage value ($V_{Z1}$) for the first conductor 532 as sensed by the contactless voltage sensing device 508 may be represented by Equation (4).

$$V_{Z1} = \frac{\frac{1}{Z_{12}} + \frac{1}{Z_{13}} + \frac{1}{Z_{p1}}}{\frac{1}{Z_{11}} + \frac{1}{Z_{12}} + \frac{1}{Z_{13}} + \frac{1}{Z_{p1}}} V_{L1} + \frac{\frac{1}{Z_{12}}}{\frac{1}{Z_{11}} + \frac{1}{Z_{12}} + \frac{1}{Z_{13}} + \frac{1}{Z_{p1}}} V_{L2} + \quad \text{Equation (4)}$$

$$\frac{\frac{1}{Z_{13}}}{\frac{1}{Z_{11}} + \frac{1}{Z_{12}} + \frac{1}{Z_{13}} + \frac{1}{Z_{p1}}} V_{L3}$$

where, the coefficient of $V_{L1}$ may be represented as $L_{11}$, the coefficient of $V_{L1}$ may be represented as $L_{12}$, and the coefficient of $V_{L1}$ may be represented as $L_{13}$. It may be noted that the denominator of the coefficient $L_{11}$ may be dominated by $1/Z_{11}$ as $Z_{11}$ is relatively small than $Z_{p1}$, $Z_{12}$ and $Z_{13}$.

In Equation (4), coefficients of $V_{L2}$ and $V_{L3}$ represent cross-coupling factors $L_{12}$ and $L_{13}$ respectively. Theoretically, it is desirable to have the cross-coupling factors $L_{12}$ and $L_{13}$ as zero. However, due to the cross-coupling phenomenon, the cross-coupling factors are non-zero. To determine the voltage, $V_{Z1}$, across the first impedance element 514 of the contactless voltage sensing device 508, in known setting, currents may be provided in the conductors in a sequential manner. Accordingly, when determining the voltage, $V_{Z1}$, across the first impedance element 514, the current flow in the neighboring conductors 534 and 536 may be maintained at about zero. Accordingly, the values of terms $V_{L2}$ and $V_{L3}$ in the Equation (2) may be maintained at 0.

Further, typically, $Z_{12}$ and $Z_{13}$ are relatively small in comparison to $Z_{p1}$, and accordingly, the numerators are dominated by the parasitic impedances due to the conductors 532, 534 and 536. Consequently, the calibration matrix becomes relatively less dependent on the reference surface, such as, ground as the contribution of $Z_{p1}$ does not figure in the sensed voltage values. Hence, advantageously, presence or absence of objects including conductors near the reference surface do not interfere with the sensed values of the contactless voltage sensing devices 508, 510 and 512.

Similarly, the sensed voltage value, $V_{Z2}$, appearing across the first impedance element 520, of the contactless voltage sensing device 510 and the sensed voltage value, $V_{Z3}$, appearing across the first impedance element 524, of the contactless voltage sensing device 512 may be determined using corresponding equations similar to Equation (4). Further, the values of $V_{Z2}$ and $V_{Z3}$ may be calculated and the calibration matrix may be determined as represented by Equations (2) and (3).

In certain embodiments, the terms of the calibration matrix [M] may also depend on relative spatial locations and geometries of the antennae of the contactless voltage sensing devices 508, 510 and 512 and the neighboring conductors 532, 534 and/or 536, as well as electrically conductive shields of contactless voltage sensing devices of the neighboring conductors. By way of example, an antenna having relatively large size may have a relatively higher cross-coupling with neighboring conductors. Accordingly, the antenna having larger size may have lower parasitic impedance. Further, due to the dependence of the matrix terms on relative geometry of the contactless voltage sensing devices and the neighboring conductors, one or more of the matrix terms may be same in the lab as well as in the field, if the geometry and spatial relations in the field and the lab are relatively similar. Accordingly, one or more when the contactless voltage sensing device is employed in the field, the calibration matrix may be measured beforehand in the lab.

In certain embodiments, the calibration matrix may be modified from time to time. By way of example, the calibration matrix may be modified after a maintenance period by performing similar procedure of measuring a conductor voltage once on the field again. Thus, the contactless voltage sensing device may provide accurate and cross-coupling measurement of the voltages of the conductors along with their phases.

In some embodiments, the values of $V_{L1}$, $V_{L2}$ and $V_{L3}$ may be measured in a known setting, such as that of a lab, where known values of $V_{L1}$, $V_{L2}$ and $V_{L3}$ may be employed. Further, in some embodiments, conductors may be powered sequentially at different times to deduce values of various cross-coupling factors in the calibration matrix. Additionally, in some of these embodiments, when a given conductor is powered on, the other conductors may be maintained at the reference potential. Moreover, the values of $V_{L1}$, $V_{L2}$ and $V_{L3}$ may be reliably reconstructed in both phase and amplitude outside the lab settings.

In certain embodiments, the calibration methods of the present specification may be used in other fields, such as, but not limited to, other parameters of electric field, or other effects of electric field, such as, but not limited to, mechanical stress generated in a piezo element. Additionally, similar methods may be used for sensed leakage current values, sensed with respect to ground.

FIG. 6 is a flow chart 600 for an exemplary method for determining individual voltage values of one or more conductors of a plurality of conductors. At step 602, the method includes operatively coupling at least one voltage sensing device of the one or more voltage sensing devices to a respective conductor of a plurality of conductors. At step 604, the method includes determine a sensed voltage value using the at least one voltage sensing device, where the sensed voltage value is contributed at least in part by a voltage value of the respective conductor and voltage values of other conductors of the plurality of conductors. Further, at step 606, the method includes determining a calibration matrix comprising cross-coupling factors representative of cross-coupling between an antenna of the at least one voltage sensing device and the others conductors. In one example, the contactless voltage sensing device may be operatively coupled to a conductor in a lab setting and a calibration matrix, such as the calibration matrix represented in Equation (2) may be determined for the contactless voltage sensing device in the lab setting. In one example, the calibration matrix may be provided by sequentially powering on conductors to determine effect of cross-coupling from each neighboring sensor on the voltage sensing device. In one embodiment, an individual voltage sensing device with a known accuracy may be used to calculate the calibration matrix. In one example, the known accuracy may be higher than a desirable accuracy of the contactless voltage sensing device.

In one embodiment, 3 or more independent sets of voltages may be provided on the three power lines at three or more different instances in time, and respective matrices [M] may be calculated using equations (2), (3) and (4). Moreover, at step 608, the method includes determining the voltage value of the respective conductor by deducting at least in part contributions of the cross-coupling from the sensed voltage value using the calibration matrix.

Optionally, the method may also include time synchronizing the sensed voltage values of the respective conductors. In some embodiments, the GPS signals may be used for time synchronizing the sensed voltage values across the contactless voltage sensing devices. Additionally, in certain embodiments, the calibration matrix may be refined further for enhanced accuracy of measurements. By way of example, a correction factor for the calibration matrix may be determined using the corrected values and the sensed values obtained after first calibration.

Advantageously, the systems and methods of the present specification are configured to provide voltage values that are relatively more accurate, thereby, enhancing the sensing capability at the providers end to facilitate monitoring of the distribution networks.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A calibration method for enhancing a measurement accuracy of one or more voltage sensing devices in the presence of a plurality of conductors, the method comprising:
    operatively coupling at least one voltage sensing device of the one or more voltage sensing devices to a respective conductor of the plurality of conductors;
    determining a sensed voltage value relative to a voltage potential at a reference surface of the respective conductor using the at least one voltage sensing device;
    determining a calibration matrix comprising cross-coupling factors representative of cross-coupling between an antenna of the at least one voltage sensing device and other conductors of the plurality of conductors, wherein the at least one voltage sensing device includes:
        a first impedance element having a first impedance value, the first impedance element operatively coupled to the antenna and the respective conductor; and
        a second impedance element having a second impedance value, wherein the second impedance element is formed in part by the antenna operatively coupled to the first impedance element and only one parasitic impedance element having a parasitic impedance value, and wherein the second impedance value is higher than the first impedance value by a multiple of about 50 (fifty) to about 10,000 (ten thousand); and
    determining a corrected voltage value of the respective conductor by deducting at least in part contributions of the cross-coupling from the sensed voltage value of the respective conductor using the calibration matrix.

2. The calibration method of claim 1, wherein the plurality of conductors are disposed in a determined geometry.

3. The calibration method of claim 1, wherein the voltage sensing device is a contactless voltage sensing device, wherein the contactless voltage sensing device further includes measurement and communication circuitry coupled to the first impedance element and configured to determine the sensed voltage value of the respective conductor, and wherein the measurement accuracy is not substantially influenced by a presence of at least one object including at least one conductor object between the contactless voltage sensing device and the reference surface.

4. The calibration method of claim 3, wherein the contactless voltage sensing device further comprises an electrically conductive element configured to provide shielding on one or more sides of the first impedance element.

5. The calibration method of claim 3, wherein the other conductors of the plurality of conductors are operatively coupled to respective contactless voltage sensing devices, and wherein one or more respective contactless voltage sensing devices comprise an electrically conductive shield.

6. A method for determining individual voltage values of one or more power lines of multi-phase power lines relative to a voltage potential at a reference surface, said method comprising:
 operatively coupling respective contactless voltage sensing devices to one or more power lines of the multi-phase power lines, wherein each of the respective contactless voltage sensing devices, comprises:
  a first impedance element having a first impedance value, wherein the first impedance element is configured to be operatively coupled to a respective power line of the one or more power lines;
  an antenna operatively coupled to the first impedance element;
  a second impedance element having a second impedance value, wherein the second impedance element is formed in part by the antenna and only one parasitic impedance element having a parasitic impedance value, and wherein the second impedance value is higher than the first impedance value by a multiple of about 50 (fifty) to about 10,000 (ten thousand); and
  measurement and control circuitry operatively coupled to the first impedance element;
 determining sensed voltage values for the one or more power lines of the multi-phase power lines using the respective contactless voltage sensing devices;
 determining a calibration matrix comprising cross-coupling factors, wherein the cross-coupling factors are representative of cross-coupling between a respective antenna of the respective contactless voltage sensing device and other power lines of the multi-phase power lines; and
 determining the individual voltage values of the respective power lines by deducting at least in part contributions of the cross-coupling from the sensed voltage values using the calibration matrix.

7. The method of claim 6, wherein a relation between the individual voltage values and the sensed voltage values of three power lines in a three-phase power lines is represented by:

$$\begin{bmatrix} L_{11} L_{12} L_{13} \\ L_{21} L_{22} L_{23} \\ L_{31} L_{32} L_{33} \end{bmatrix} \begin{bmatrix} V_{L1} \\ V_{L2} \\ V_{L3} \end{bmatrix} = \begin{bmatrix} V_{Z1} \\ V_{Z2} \\ V_{Z3} \end{bmatrix}$$

wherein, $V_{L1}$, $V_{L2}$ and $V_{L3}$ are the individual voltage values of the three power lines, $V_{Z1}$, $V_{Z2}$ and $V_{Z3}$ are the sensed voltage values of the three power lines, and [L] is a matrix.

8. The method of claim 7, wherein the calibration matrix is represented by:

$$[M] = \begin{bmatrix} M_{11} M_{12} M_{13} \\ M_{21} M_{22} M_{23} \\ M_{31} M_{32} M_{33} \end{bmatrix} = \begin{bmatrix} L_{11} L_{12} L_{13} \\ L_{21} L_{22} L_{23} \\ L_{31} L_{32} L_{33} \end{bmatrix}^{-1}$$

wherein, [M] is the calibration matrix.

9. The method of claim 7, wherein the one or more power lines of multi-phase power lines includes a first, a second, and a third three-phase power line, and wherein the sensed voltage value ($V_{Z1}$) of the first three-phase power line sensed by one of the contactless voltage sensing devices coupled thereto is defined by:

$$V_{Z1} = \frac{\frac{1}{Z_{12}} + \frac{1}{Z_{13}} + \frac{1}{Z_{p1}}}{\frac{1}{Z_{11}} + \frac{1}{Z_{12}} + \frac{1}{Z_{13}} + \frac{1}{Z_{p1}}} V_{L1} + \frac{\frac{1}{Z_{12}}}{\frac{1}{Z_{11}} + \frac{1}{Z_{12}} + \frac{1}{Z_{13}} + \frac{1}{Z_{p1}}} V_{L2} + \frac{\frac{1}{Z_{13}}}{\frac{1}{Z_{11}} + \frac{1}{Z_{12}} + \frac{1}{Z_{13}} + \frac{1}{Z_{p1}}} V_{L3},$$

wherein $Z_{11}$ is the first impedance, $Z_{12}$ is a parasitic impedance between the antenna and the second three-phase power line, $Z_{13}$ is a parasitic impedance between the antenna and the third three-phase power line, and $Z_{p1}$ is a parasitic capacitance between the antenna and the reference surface.

10. The method of claim 6, further comprising time synchronizing the sensed voltage values of the respective contactless voltage sensing devices of the one or more power lines.

11. The method of claim 6, wherein each power line of the multi-phase power lines is operatively coupled to a respective contactless voltage sensing device, and wherein a measurement accuracy of said determining sensed voltage values for the one or more power lines of the multi-phase power lines using the respective contactless voltage sensing devices is not substantially influenced by a presence of at least one object including at least one conductor object between the respective contactless voltage sensing device and the reference surface.

12. The method of claim 11, wherein at least one contactless voltage sensing device comprises an electrically conductive shield.

13. The method of claim 6, further comprising providing electrical currents to the multi-phase power lines in a sequential manner to deduce the calibration matrix.

14. The method of claim 13, further comprising maintaining other power lines of the multi-phase power lines at a reference potential, while simultaneously providing the electrical currents to the multi-phase power lines in a sequential manner to deduce the calibration matrix.

15. A monitoring system, comprising:
 a plurality of conductors;
 a plurality of contactless voltage sensing devices, wherein each contactless voltage sensing device of the plurality of contactless voltage sensing devices is coupled to a respective conductor of the plurality of conductors, the respective conductor having a voltage value relative to a voltage potential at a reference surface, wherein one or more contactless voltage sensing devices of the plurality of contactless voltage sensing devices comprise:
  a first impedance element having a first impedance value, wherein the first impedance element is configured to be operatively coupled to the respective conductor;
  an antenna operatively coupled to the first impedance element;
  a second impedance element having a second impedance value, wherein the second impedance element is formed in part by the antenna and only one parasitic impedance element, and wherein the only one parasitic impedance element comprises a parasitic impedance value, and wherein the second impedance value is higher than the first impedance value by a multiple of about 50 (fifty) to about 10,000 (ten thousand);

measurement and communication circuitry coupled to the first impedance element to measure the voltage value of the respective conductor; and a monitoring unit operatively coupled to one or more contactless voltage sensing devices of the plurality of contactless voltage sensing devices and configured to determine voltage values of the respective conductor of the plurality of conductors.

16. The monitoring system of claim 15, wherein the monitoring unit is configured to:

determine a calibration matrix comprising cross-coupling factors representative of cross-coupling between one or more contactless voltage sensing devices of the plurality of contactless voltage sensing devices and respective one or more neighboring conductors of the plurality of conductors; and deduct at least in part contributions of the cross-coupling from sensed voltage values to obtain corrected voltage values of the one or more conductors of the plurality of conductors.

17. The monitoring system of claim 15, wherein the plurality of conductors are disposed in a determined geometry with respect to one another.

18. The monitoring system of claim 17, wherein the determined geometry comprises a distance between two or more conductors of the plurality of conductors, relative orientation of the two or more conductors of the plurality of conductors, a layout of the two or more conductors of the plurality of conductors, a cross-section of the two or more conductors of the plurality of conductors, or combinations thereof.

19. The monitoring system of claim 15, wherein the plurality of conductors comprises three-phase power lines, wherein each power line of the three-phase power lines comprises a respective contactless voltage sensing device of said plurality of contactless voltage sensing devices, and wherein a measurement accuracy of the monitoring unit is not substantially influenced by a presence of at least one object including at least one conductor object between the respective contactless voltage sensing device and the reference surface.

* * * * *